United States Patent
Fogel et al.

(10) Patent No.: US 9,741,807 B2
(45) Date of Patent: Aug. 22, 2017

(54) FINFET DEVICE WITH VERTICAL SILICIDE ON RECESSED SOURCE/DRAIN EPITAXY REGIONS

(71) Applicant: INTERNATIONAL BUSINESS MACHINES CORPORATION, Armonk, NY (US)

(72) Inventors: Keith E. Fogel, Hopewell Junction, NY (US); Pranita Kerber, Mount Kisco, NY (US); Qiqing C. Ouyang, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/359,929

(22) Filed: Nov. 23, 2016

(65) Prior Publication Data

US 2017/0077249 A1    Mar. 16, 2017

Related U.S. Application Data

(60) Continuation of application No. 15/183,034, filed on Jun. 15, 2016, now Pat. No. 9,576,806, which is a
(Continued)

(51) Int. Cl.
| | |
|---|---|
| *H01L 29/76* | (2006.01) |
| *H01L 29/417* | (2006.01) |
| *H01L 29/66* | (2006.01) |
| *H01L 29/78* | (2006.01) |

(Continued)

(52) U.S. Cl.
CPC .. *H01L 29/41791* (2013.01); *H01L 21/28518* (2013.01); *H01L 21/76805* (2013.01); *H01L 21/76895* (2013.01); *H01L 23/535* (2013.01);
*H01L 27/0886* (2013.01); *H01L 29/0847* (2013.01); *H01L 29/16* (2013.01); *H01L 29/161* (2013.01); *H01L 29/165* (2013.01);
(Continued)

(58) Field of Classification Search
CPC ......... H01L 29/41791; H01L 21/28518; H01L 29/66795
USPC ....................................................... 257/288
See application file for complete search history.

(56) References Cited

U.S. PATENT DOCUMENTS

| | | | |
|---|---|---|---|
| 7,635,632 B2 | 12/2009 | Yeo et al. | |
| 7,667,271 B2 | 2/2010 | Yu et al. | |

(Continued)

OTHER PUBLICATIONS

List of IBM Patents or Patent Applications Treated as Related dated Nov. 23, 2016, 2 pages.

*Primary Examiner* — Long K Tran
(74) *Attorney, Agent, or Firm* — Tutunjian & Bitetto, P.C.; Vazken Alexanian

(57) ABSTRACT

A method of forming a semiconductor device that includes forming a fin structure from a semiconductor substrate, and forming a gate structure on a channel region portion of the fin structure. A source region and a drain region are formed on a source region portion and a drain region portion of the fin structure on opposing sides of the channel portion of the fin structure. At least one sidewall of the source region portion and the drain region portion of the fin structure is exposed. A metal semiconductor alloy is formed on the at least one sidewall of the source region portion and the drain region portion of the fin structure that is exposed.

19 Claims, 10 Drawing Sheets

Related U.S. Application Data division of application No. 14/583,454, filed on Dec. 26, 2014, now Pat. No. 9,391,173.

(60) Provisional application No. 61/982,616, filed on Apr. 22, 2014.

(51) Int. Cl.

| | | |
|---|---|---|
| *H01L 29/08* | (2006.01) | |
| *H01L 21/285* | (2006.01) | |
| *H01L 21/768* | (2006.01) | |
| *H01L 23/535* | (2006.01) | |
| *H01L 29/16* | (2006.01) | |
| *H01L 29/161* | (2006.01) | |
| *H01L 29/165* | (2006.01) | |
| *H01L 27/088* | (2006.01) | |
| *H01L 29/45* | (2006.01) | |

(52) U.S. Cl.
CPC .......... *H01L 29/1608* (2013.01); *H01L 29/45* (2013.01); *H01L 29/456* (2013.01); *H01L 29/665* (2013.01); *H01L 29/66545* (2013.01); *H01L 29/66636* (2013.01); *H01L 29/66795* (2013.01); *H01L 29/785* (2013.01); *H01L 29/7848* (2013.01); *H01L 29/7851* (2013.01)

(56) References Cited

U.S. PATENT DOCUMENTS

| | | | |
|---|---|---|---|
| 8,207,038 B2 | 6/2012 | Cheng et al. | |
| 8,399,931 B2 | 3/2013 | Liaw et al. | |
| 2007/0148836 A1* | 6/2007 | Cheng | H01L 21/823418 438/157 |
| 2009/0001426 A1 | 1/2009 | Cheng et al. | |
| 2011/0284967 A1* | 11/2011 | Cheng | H01L 21/823821 257/368 |
| 2012/0193712 A1 | 8/2012 | Bryant et al. | |
| 2012/0256238 A1* | 10/2012 | Ning | H01L 21/84 257/280 |
| 2012/0292673 A1 | 11/2012 | Xu | |
| 2013/0122668 A1 | 5/2013 | Anderson et al. | |
| 2013/0175624 A1 | 7/2013 | Chang et al. | |

\* cited by examiner

US 9,741,807 B2

FINFET DEVICE WITH VERTICAL SILICIDE ON RECESSED SOURCE/DRAIN EPITAXY REGIONS

BACKGROUND

Technical Field

The present disclosure relates generally to semiconductor fabrication, and more particularly to structures and methods for forming fin field effect transistors (FinFETs).

Description of the Related Art

With the continuing trend towards miniaturization of integrated circuits (ICs), there is a need for transistors to have higher drive currents with increasingly smaller dimensions. FinFET technology is becoming more prevalent as device size continues to shrink.

SUMMARY

In one embodiment, a method for forming a semiconductor device is provided that includes forming a gate structure on a channel region portion of a fin structure. An epitaxial source region structure and an epitaxial drain region structure are formed on a source region portion and a drain region portion of the fin structure on opposing sides of the channel region portion of the fin structure. At least one sidewall of the epitaxial source region structure and the epitaxial drain region structure may then be exposed. A metal semiconductor alloy contact structure may then be formed on the at least one sidewall of the epitaxial source region portion and the epitaxial drain region portion.

In another embodiment, the method for forming the semiconductor device may include forming a plurality of gate structures on fin structures and forming an epitaxial source region structure and an epitaxial drain region structure on a source region portion and a drain region portion for the fin structures on opposing sides of the channel portion of the fin structures that is underlying each of the plurality of gate structures. A portion of the fin structures may be removed, as well as a portion of the epitaxial source region, and a portion of the epitaxial drain region between adjacent gate structures of the plurality of gate structures. A plurality of metal semiconductor alloy contact structures are formed on sidewalls of the epitaxial source region and the epitaxial drain region. The metal semiconductor alloy contact structures are also present on sidewalls of the source region portion and the drain region portion for the fin structure for each gate structure of the adjacent gate structures.

In another aspect of the present disclosure, a semiconductor device is disclosed that includes at least one fin field effect transistor including a fin structure including a channel region portion, a source region portion and a drain region portion. A metal semiconductor alloy contact structure is present on a sidewall of at least one of the source region portion and the drain region portion of the fin structure and present on a sidewall of epitaxial source and drain region structures. A gate structure is present on the channel region portion of the fin structure.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
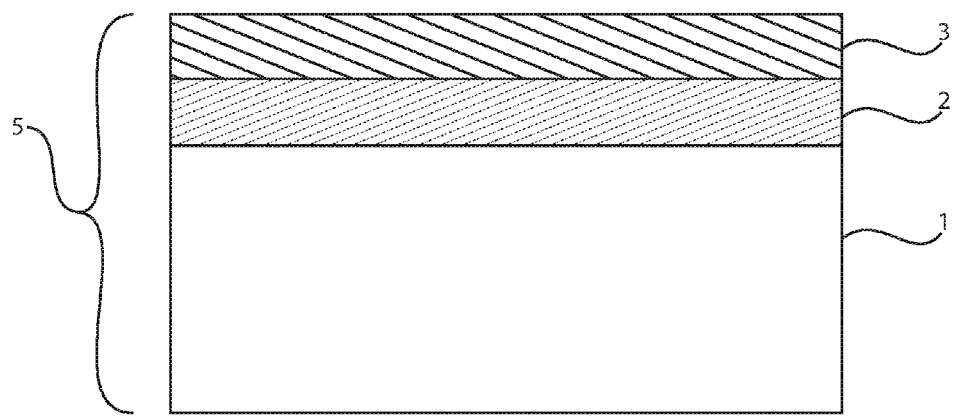
FIG. 1 is a side cross-sectional view of a semiconductor on insulator (SOI) substrate, as used in one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a metal semiconductor alloy contact structure on the sidewalls of the source region portion and the drain region portion of a fin structure in a FinFET semiconductor device. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. A "field effect transistor (FET)" is a semiconductor device in which the output current, i.e., source-drain current, is controlled by the voltage applied to the gate. A FET has three terminals, i.e., gate structure, source region and drain region. A gate structure is a structure used to control output current (i.e., flow of carriers in the channel) of a semiconducting device through electrical fields. A FinFET is a field effect transistor in which at least the channel portion of the field effect transistor is present in a fin structure. The channel is the region underlying the gate structure and between the source and drain region of a semiconductor device that becomes conductive when the semiconductor device is turned on.

Aggressive scaling of the complementary metal oxide semiconductor (CMOS) devices typically results in increased access resistance to the device. A large portion of the access resistance may be due to a shorter metal/semiconductor contact length and higher contact resistance. In some embodiments, the methods and structures disclosed herein, form metal semiconductor alloy contacts on the sidewalls of the source and drain region portions of the fin structure of a FinFET semiconductor device. By forming the metal semiconductor alloy contacts on the sidewalls of the source and drain region portions of the fin structure, the methods and structures that are disclosed herein can reduce the access resistance in the FinFET semiconductor device, while keeping the device capacitance the same. The methods and structures of the present disclosure are now discussed with more detail referring to FIGS. 1-17.

FIG. 1 depicts a semiconductor substrate 5 as used in one embodiment of the present disclosure. In one embodiment, the semiconductor substrate 5 is a semiconductor on insulator (SOI) substrate that includes a bottom semiconductor layer 1 and a top semiconductor layer 3 (which is interchangeably referred to as a semiconductor on insulator (SOI) layer 3) that are electrically isolated from each other by a buried insulating layer 2. The top semiconductor layer 3 and the bottom semiconductor layer 1 may comprise at least one of Si, Ge, SiGe alloys, SiGe:C, SiC, Si:C, GaAs, InAs, InP, as well as other III/V or II/VI compound semiconductors. The SOI layer 3 and bottom semiconductor layer 1 may comprise the same or different materials. In one example, the entire SOI layer 3, or a portion of the SOI layer 3, may be amorphous, polycrystalline, or monocrystalline. In one example, the entire bottom semiconductor layer 1, or a portion of the bottom semiconductor layer 1, may be amorphous, polycrystalline, or monocrystalline.

In addition to the aforementioned types of semiconductor substrates, the semiconductor substrate employed in the present disclose may also comprise a hybrid orientation semiconductor substrate in which the SOI layer 3 and the bottom semiconductor layer 1 have surface regions of different crystallographic orientations. The SOI layer 3 and the bottom semiconductor layer 1 may be doped, undoped or contain doped regions and undoped regions therein. Further, the top semiconductor layer 3 and the bottom semiconductor layer 1 may contain regions with strain and regions without strain therein. In one example, the SOI layer 3 and the bottom semiconductor layer 1 may contain regions of tensile strain and compressive strain.

The buried insulating layer 2 separating the SOI layer 3 and the bottom semiconductor layer 1 may be a crystalline or non-crystalline oxide, nitride, oxynitride, or any other suitable insulating material. The SOI substrate employed in the present disclosure may be formed utilizing a layer transfer process including a bonding step. Alternatively, an implantation process such as SIMOX (Separation by IMplantation of OXygen) can be used in forming the SOI substrate.

The thickness of the various layers of the SOI substrate may vary depending on the technique used in forming the same. In one embodiment, the top semiconductor layer 3 has a thickness from 3 nm to 100 nm, and the buried insulating layer 2 has a thickness from 10 nm to 150 nm.

It is noted that although an SOI substrate is depicted and described in the following discussion, embodiments of the present disclosure are contemplated that utilize a bulk semiconductor substrate. In one example of the present disclosure, in which a bulk semiconductor substrate is used, the bulk semiconductor substrate comprises at least one of Si, Ge, SiGe alloys, SiGe:C, SiC, Si:C, GaAs, InAs, InP, as well as other III/V or II/VI compound semiconductors. In the embodiments, in which the semiconductor substrate for forming the fin structures is a bulk semiconductor substrate, an isolation region may be formed in the substrate to isolate adjacent fin structures.

Figure 2:
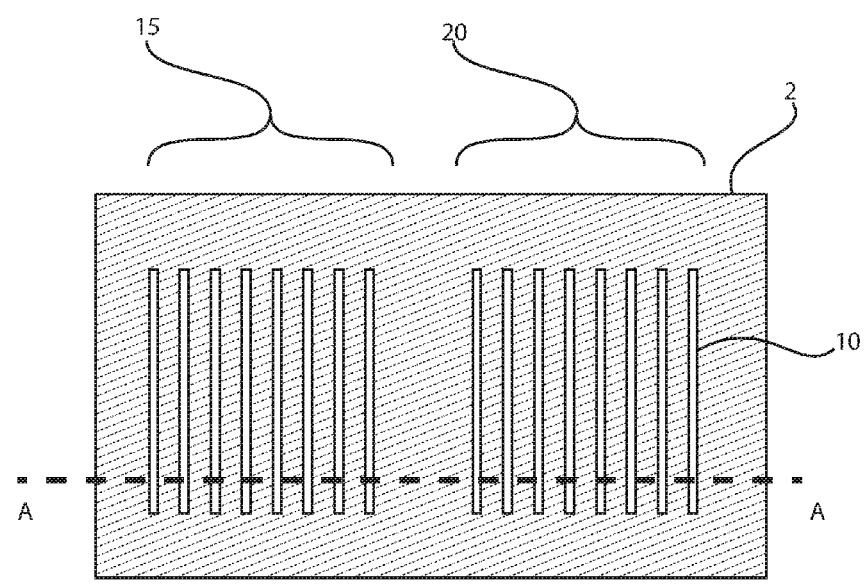
FIG. 2 is a top down view of fin structures formed from the SOI substrate that is depicted in FIG. 1, in accordance with one embodiment of the present disclosure.
Figure 3:
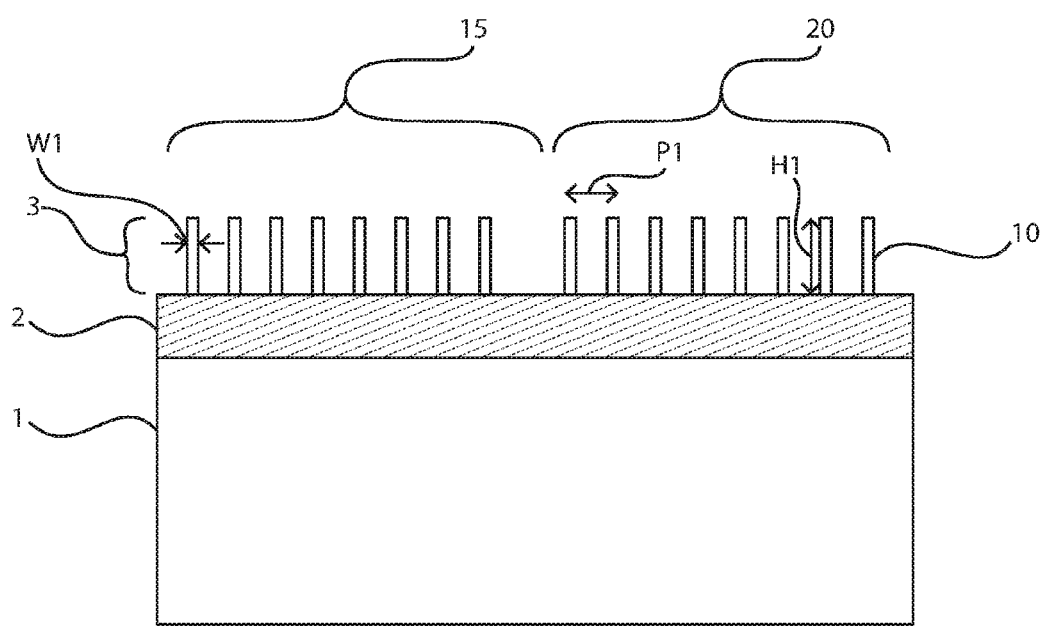
FIG. 3 is a side cross-sectional view of the fin structures depicted in FIG. 2 from the perspective of section line A-A (which is perpendicular to the length of the fin structures).

FIGS. 2 and 3 depict one embodiment of forming fin structures 10 from the semiconductor substrate 5 depicted in FIG. 1. For example, the plurality of fin structures 10 may be formed using photolithography and etch processes. For example, prior to etching the SOI layer 3 to provide the plurality of fin structures 10, a layer of the dielectric material is deposited atop the upper surface of the SOI substrate to provide a dielectric fin cap (not shown in FIGS. 2 and 3).

The material layer that provides the dielectric fin cap may be composed of a nitride, oxide, oxynitride material, and/or any other suitable dielectric layer. The dielectric fin cap may comprise a single layer of dielectric material or multiple layers of dielectric materials. The material layer that provides the dielectric fin cap can be formed by a deposition process, such as chemical vapor deposition (CVD) and/or atomic layer deposition (ALD). Alternatively, the material layer that provides the dielectric fin cap may be formed using a growth process, such as thermal oxidation or thermal nitridation. The material layer that provides the dielectric fin cap may have a thickness ranging from 1 nm to 100 nm. In one example, the dielectric fin cap is composed of an oxide, such as $SiO_2$, that is formed by CVD to a thickness ranging from 25 nm to 50 nm.

In one embodiment, following the formation of the layer of dielectric material that provides the dielectric fin cap, a photolithography and etch process sequence is applied to the material layer for the dielectric fin cap and the semiconductor substrate 5. Specifically, in one example, a photoresist mask is formed overlying the layer of the dielectric material that provides dielectric fin cap and is present overlying the semiconductor substrate 5, in which the portion of the dielectric material that is underlying the photoresist mask provides the dielectric fin cap, and the portion of the semiconductor substrate 5 that is underlying the photoresist mask provides the plurality of fin structures 10. The exposed portions of the dielectric material that provides dielectric fin cap and the portion of the semiconductor substrate 5 that are not protected by the photoresist mask are removed using a selective etch process. To provide the photoresist mask, a photoresist layer is first positioned on the layer of the dielectric material that provides dielectric fin cap. The photoresist layer may be provided by a blanket layer of photoresist material that is formed utilizing a deposition process such as, e.g., plasma enhanced CVD (PECVD), evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap followed by removing a portion of the exposed SOI layer 3 selectively to the photoresist mask and the buried insulating layer 2. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The etch process may be timed to determine the height of the fin structures 10. In some embodiments, following etching of the semiconductor substrate 5 to define the fin structures 10, the dielectric fin cap may be removed by a selective etch.

As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater, e.g., 1000:1.

Referring to FIG. 3, each of the fin structures 10 may have a height $H_1$ ranging from 5 nm to 200 nm. In another embodiment, each of the fin structures 10 has a height $H_1$ ranging from 10 nm to 100 nm. In one example, each of the fin structures 10 has a height $H_1$ ranging from 20 nm to 60 nm. Each of the plurality of fin structures 10 may have a width $W_1$ of less than 20 nm. In another embodiment, each of the fin structures 10 has a width $W_1$ ranging from 3 nm to 12 nm. Although sixteen fin structures 10 are depicted in FIG. 2, the present disclosure is not limited to only this example. It is noted that any number of fin structures 10 may be formed from the semiconductor substrate 5. The pitch P1 separating adjacent fin structures 10 may range from 10 nm to 60 nm. In another example, the pitch P1 separating adjacent fin structures 10 may range from 20 nm to 50 nm.

Referring to FIGS. 2 and 3, in some embodiments, a first portion of the fin structures 10, i.e., portion of fin structures present in an n-type device region 15, may be processed to be the fin structure of a subsequently formed n-type fin field effect transistors and a second portion of the fin structures 10, i.e., portions of fin structures present in a p-type device region 20, may be processed to provide the fin structure of a subsequently formed p-type fin field effect transistor. In some embodiments, the fin structures 10 in the n-type device region 15 may be p-type doped to provide a p-type well region prior to the formation of the source and drain regions in the n-type device region 15, and the fin structures 5 in the p-type device region 20 may be n-type doped to provide an n-type well region prior to the formation of the source and drain regions in the p-type device region 20. The p-type or n-type dopant may be selectively introduced to the fin structures in one of the n-type device region 15 or p-type device region 20 while the other device region is protected by a block mask, such as a photoresist block mask.

Figure 4:
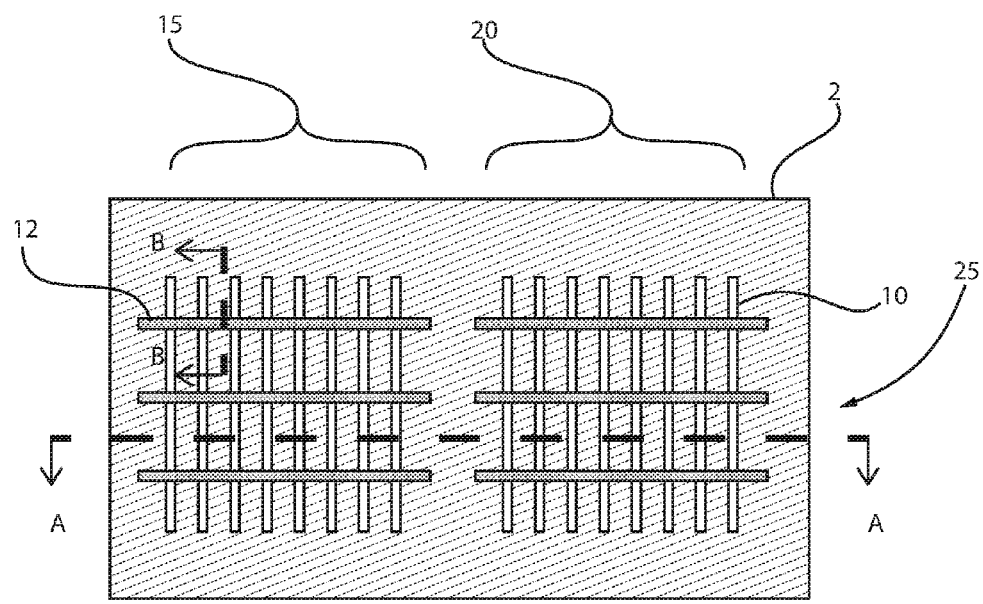
FIG. 4 is a top down view depicting forming a replacement gate structure on the fin structures that are depicted in FIG. 2, in accordance with one embodiment of the present disclosure.
Figure 5:
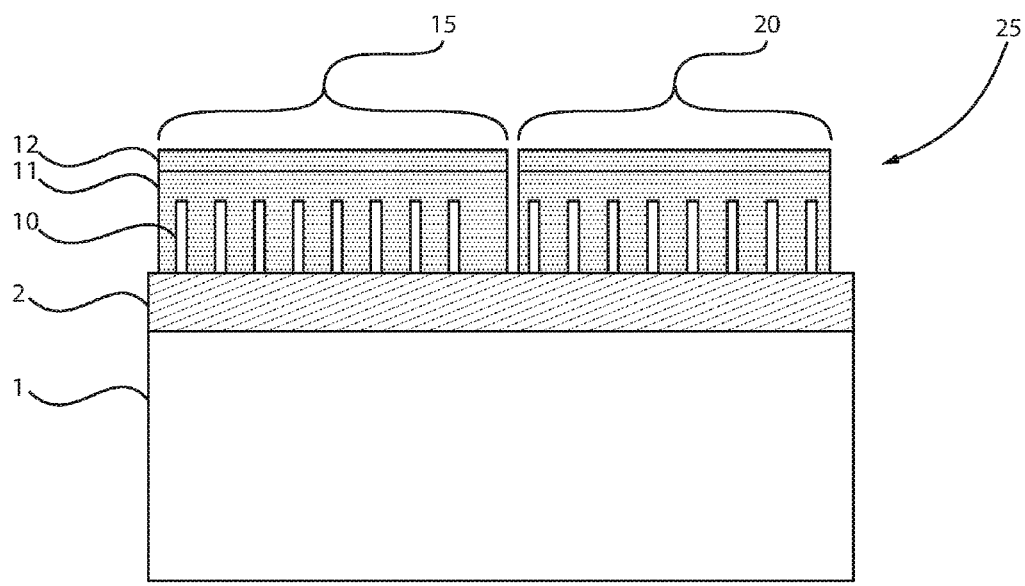
FIG. 5 is a side cross-sectional along section line A-A (cross-section perpendicular to the fin structure) of the structure depicted in FIG. 4.
Figure 6:
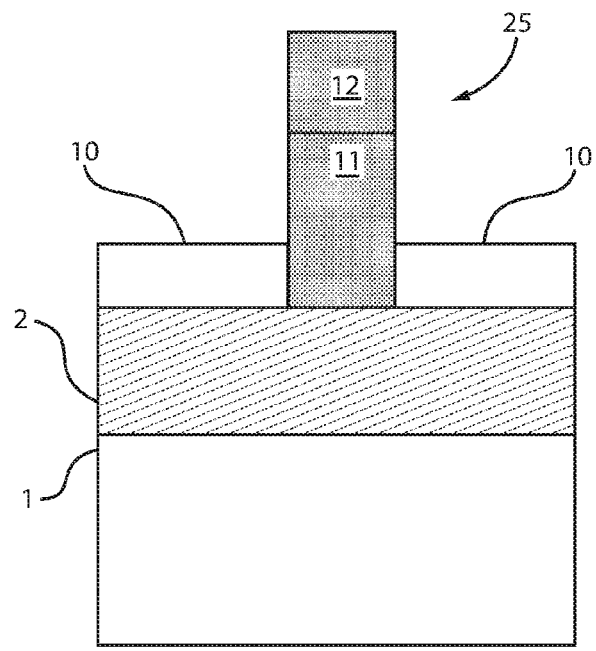
FIG. 6 is a side cross-sectional view from the perspective of section line B-B (cross-section parallel to the fin structure) of the structure depicted in FIG. 4.

FIGS. 4-6 depict forming a replacement gate structure 25 on the channel portion of the fin structures 10. As used herein, the term "replacement gate structure" denotes a sacrificial structure that dictates the geometry and location of the later formed functioning gate structure. The "functional gate structure" functions to switch the semiconductor device from an "on" to "off" state, and vice versa. In one embodiment, the replacement gate structure 25 includes an interfacial dielectric material (not shown), a sacrificial gate material 11, and a sacrificial gate cap 12.

In one embodiment, the sacrificial gate material 11 of the replacement gate structure 25 may be composed of any material that can be etched selectively to the fin structures 10 and the buried dielectric layer 2. In one embodiment, the sacrificial gate material 11 of the replacement gate structure 25 may be composed of a silicon-including material, such as polysilicon. In some embodiments, an interfacial dielectric material, such as interfacial silicon oxide, may be formed between the fin structures 10 and the sacrificial gate material 11.

In one embodiment, the sacrificial gate cap 12 may be composed of a dielectric material, such as an oxide, nitride or oxynitride material, or amorphous carbon. The sacrificial materials that provide the sacrificial gate material 11 and the sacrificial gate cap 12 may be patterned and etched to provide the replacement gate structure 25. It is noted that the replacement gate structure 25 is not limited to only the example that is depicted in FIGS. 4, 5 and 6. For example, the replacement gate structure 25 may be composed of any number of material layers and any number of material compositions, so long as the sacrificial gate material 11 can be removed selectively to the plurality of fin structures 10.

Figure 7:
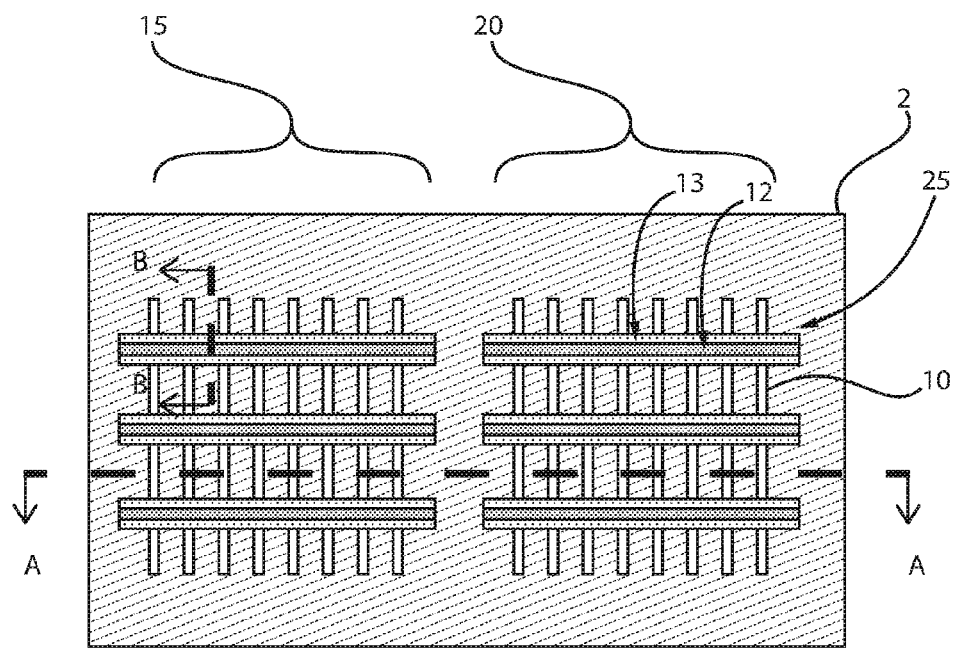
FIG. 7 is a top down view depicting forming a first gate sidewall spacer on the replacement gate structure, in accordance with one embodiment of the present disclosure.
Figure 8:
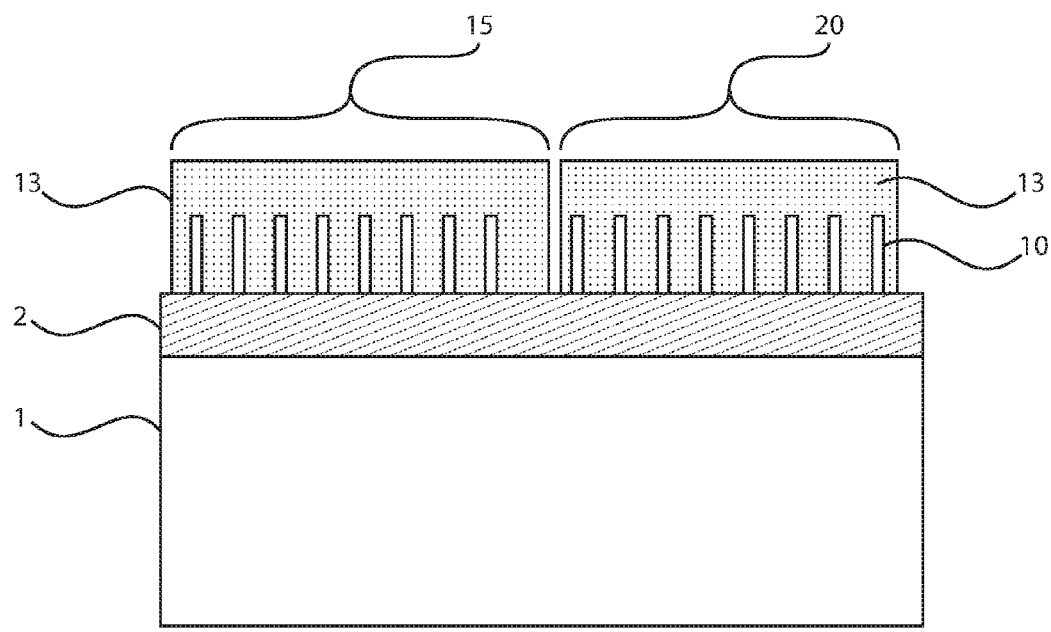
FIG. 8 is a side cross-sectional view of the structure depicted in FIG. 7 from the perspective of section line A-A (cross-section perpendicular to the fin structure).
Figure 9:
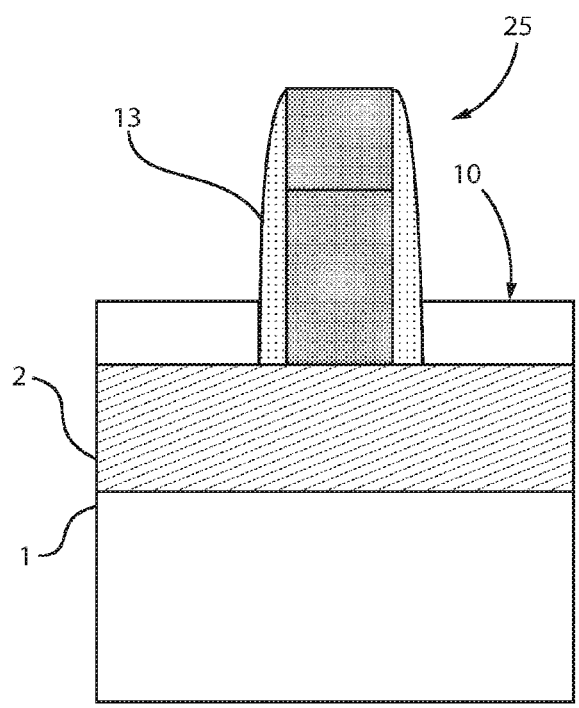
FIG. 9 is a side cross-sectional view of the structure depicted in FIG. 7 from the perspective of section line B-B (cross-section parallel to the fin structure).

Referring to FIGS. 7, 8 and 9, in some embodiments a first gate sidewall spacer 13 is formed on the sidewall of the replacement gate structure 25. In one embodiment, the first gate sidewall spacer 13 may be formed by using a blanket layer deposition process, such as CVD, and an anisotropic etchback method. The first gate sidewall spacer 13 may have a width ranging from 2.0 nm to 15.0 nm, and may be composed of a dielectric, such as a nitride, oxide, oxynitride, or a combination thereof. In one example, the first gate sidewall spacer 13 may be composed of silicon oxide ($SiO_2$).

Figure 10:
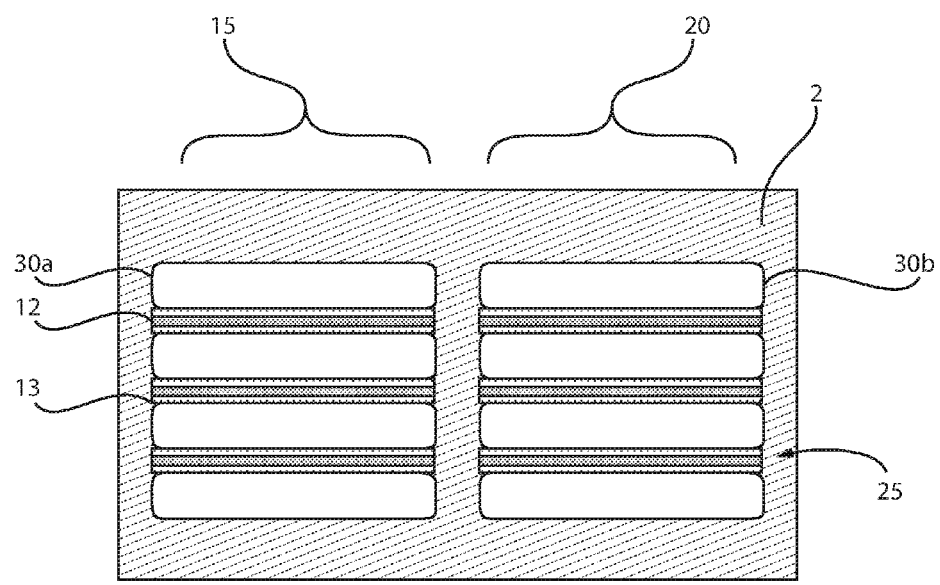
FIG. 10 is a top down view depicting forming epitaxial source and drain merge regions on the fin structures, in accordance with one embodiment of the present disclosure.
Figure 11:
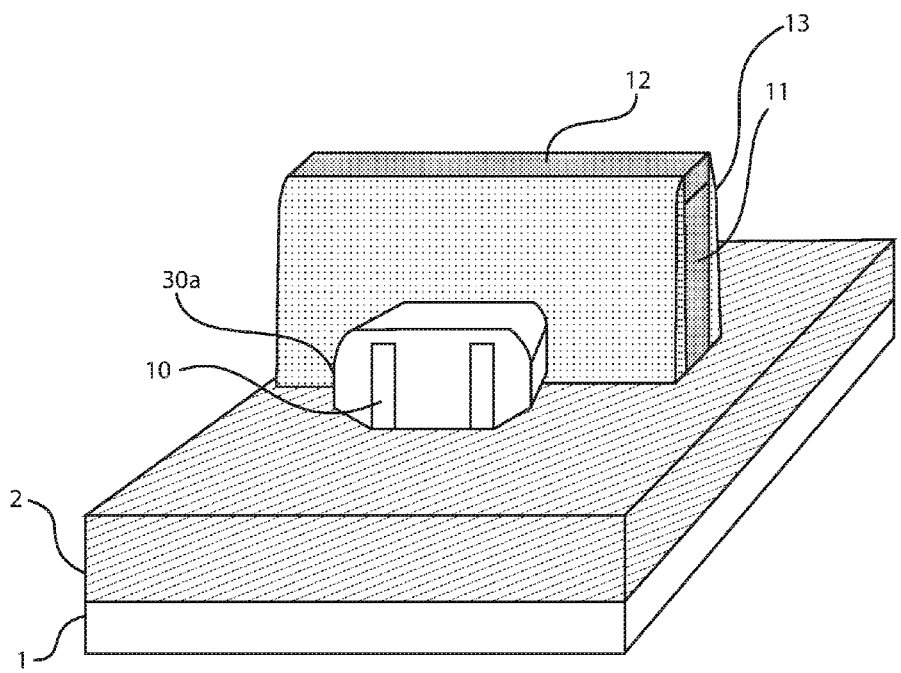
FIG. 11 is a perspective view of the epitaxial source and drain merge regions on two fin structures that are depicted in FIG. 10.

FIGS. 10 and 11 depict forming a source region on the source region portion of the fin structures 10 and forming a drain region on the drain region portion of the fin structures 10. As used herein, the term "drain region" means a doped region in semiconductor device located at the end of the channel, in which carriers are flowing out of the transistor through the drain. As used herein, the term "source region" is a doped region in the semiconductor device, in which majority carriers are flowing into the channel. The source region portion and the drain region portion of the fin structures 10 in the p-type device region 20 are doped to a p-type conductivity to provide a p-type FinFET. As used herein, "p-type" refers to the addition of impurities to an intrinsic semiconductor that creates deficiencies of valence electrons. The p-type conductivity semiconductor devices are typically produced within silicon containing materials by doping the source and drain region portions of the fin structures 10 with elements from group III-A of the Periodic Table of Elements. In a silicon-containing fin structure, examples of p-type dopants, i.e., impurities, include but are not limited to boron, aluminum, gallium and indium.

The source region portion and the drain region portion of the fin structure 10 in the n-type device region 15 are doped to an n-type conductivity to provide an n-type FinFET. As used herein, "n-type" refers to the addition of impurities that contributes free electrons to an intrinsic semiconductor. N-type conductivity semiconductor devices are typically produced within silicon containing material by doping the source extension regions and the drain extension regions with elements from group V-A of the Periodic Table of Elements. In a silicon containing fin structure, examples of n-type dopants, i.e., impurities, include but are not limited to, antimony, arsenic and phosphorous.

FIGS. 10 and 11 depict epitaxially forming in situ doped source and drain region structures 30a on the source and drain region portions of the fin structures 10 in the n-type device region 15, and epitaxially forming in situ doped source and drain structures 30b on the source and drain region portions of the fin structures 10 in the p-type device region 20. In some embodiments, the epitaxially formed in situ doped source and drain region structures 30a, 30b are merging source and drain region structures (also referred to as epitaxial source and drain merge regions 30a, 30b), in which a single continuous portion of in situ doped epitaxial semiconductor material are in direct contact with the source and drain region portions of adjacent fin structures 10. Although not depicted in the supplied figures embodiments have also been contemplated in which the in situ doped source and drain region structures 30a on the source and drain region portions of the fin structures in the n-type device region 15 are separated from the epitaxially forming in situ doped source and drain structures 30b on the source and drain region portions of the fin structures 10 in the p-type device region 20. In some examples, this may be referred to as source and drain regions that are composed of unmerged epitaxy. Embodiments of the present disclosure that employ unmerged epitaxy have source and drain region structures with diamond shaped epitaxial material (111-facetted) around each fin, wherein the epitaxial material that is present on adjacent fin structures does not contact one another.

The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. The fact that the process is selective means that the deposited semiconductor material grows only on exposed semiconductor regions and does not grow on a dielectric, such as silicon oxide. The epitaxial growth process may be continued until the deposited in situ doped semiconductor material contacts the source and drain region portions of the adjacent fin structures. In some embodiments, the epitaxially formed in situ doped source and drain region structures 30a, 30b are composed of a silicon containing material, such as silicon, silicon germanium, or silicon doped with carbon (Si:C).

By "in-situ" it is meant that the dopant that dictates the conductivity type of the epitaxially formed in situ doped source and drain region structures 30a, 30b is introduced during the process step, e.g., epitaxial deposition, which forms the epitaxially formed in situ doped source and drain region structures 30a, 30b. In some embodiments, the extension source and drain regions may be formed after the epitaxially formed in situ doped source and drain region structures 30a, 30b are positioned on the source and drain region portions of the fin structures 10 by thermally diffusing the n-type or p-type dopant from the epitaxially formed in situ doped source and drain region structures 30a, 30b into the underlying portion of the fin structures 5. In some embodiments, the source and drain regions are activated by a high temperature anneal, while the replacement gate structure 25 is present in the structure.

The epitaxially formed in situ doped source and drain region structures 30a, 30b may be selectively formed on the fin structures 10 in one of the n-type device region 15 or p-type device region 20 while the other device region is protected by a block mask, such as a photoresist block mask.

Figure 12:
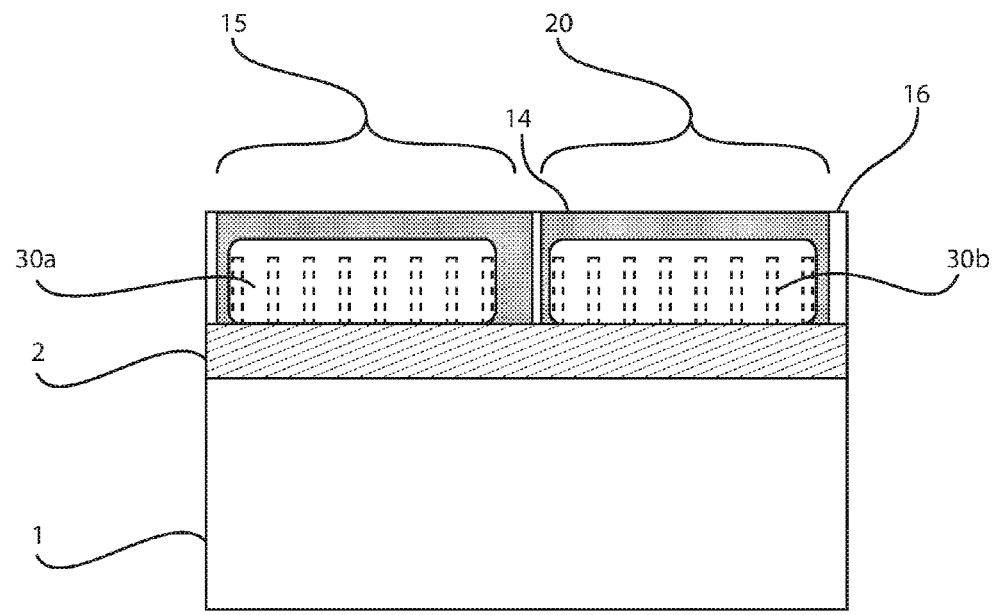
FIG. 12 is a side cross-sectional view perpendicular to the fin structures depicting forming a second gate sidewall spacer adjacent to the first gate sidewall spacer, in accordance with one embodiment of the present disclosure.
Figure 13:
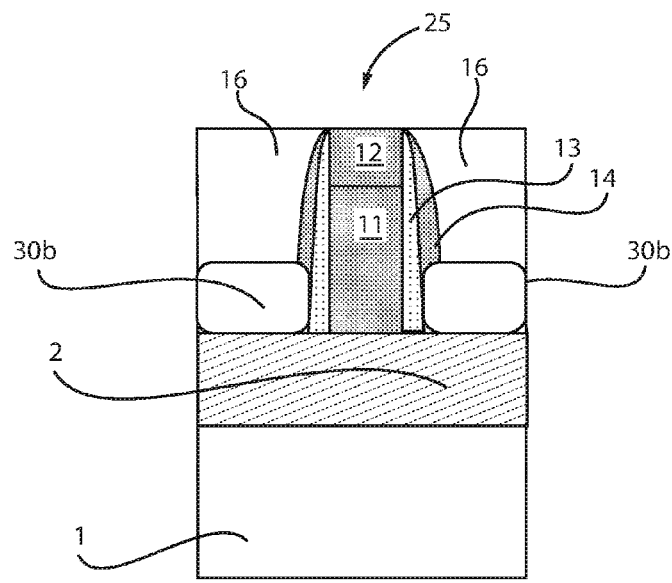
FIG. 13 is a side cross-sectional view perpendicular to the fin structure depicting forming an interlevel dielectric layer over the fin structures, the epitaxial source and drain merge regions, in accordance with one embodiment of the present disclosure.

FIGS. 12 and 13 depict one embodiment of forming a second gate sidewall spacer 14 on the first gate sidewall spacer 13. The second gate sidewall spacer 14 is similar to the first gate sidewall spacer 13 that is depicted in FIGS. 6 and 7. Therefore, the description of the first gate sidewall spacer 13 that is described above with reference to FIGS. 6 and 7 is suitable for the second gate sidewall spacer 14 that is depicted in FIGS. 8 and 9. In some embodiments, in which the first gate sidewall spacer 13 is composed of silicon oxide, the second gate sidewall spacer 14 may be composed of silicon nitride. The second gate sidewall spacer 14 covers the epitaxial material of the in situ doped source and drain region structures 30a, 30b that are present around the fin structures 5. The first gate sidewall spacer 13 only covers the fin structure 5, and is not present overlying the epitaxial material of the in situ doped source and drain region structures 30a.

FIG. 13 further depict forming an interlevel dielectric layer 16 over the epitaxial source and drain region structures 30a, 30b, the fin structures 10 and the replacement gate structure 25, and planarizing the interlevel dielectric layer 16 to be coplanar with an upper surface of the replacement gate structure 25. The interlevel dielectric layer 16 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the interlevel dielectric layer 16 include any of the aforementioned materials in porous form, or in a form that changes during processing to or from being porous and/or permeable to being non-porous and/or non-permeable. The interlevel dielectric layer 16 may be deposited using at least one of spinning from solution, spraying from solution, chemical vapor deposition (CVD), plasma enhanced CVD (PECVD), sputter deposition, reactive sputter deposition, ion-beam deposition, and evaporation.

Following deposition of the dielectric material for the interlevel dielectric layer 16, a planarization processes is conducted to provide an upper surface, wherein the upper surface of the interlevel dielectric layer 16 is coplanar with the upper surface of the replacement gate structure 25. The planarization of the interlevel dielectric layer 16 may be provided by chemical mechanical planarization.

Figure 14:
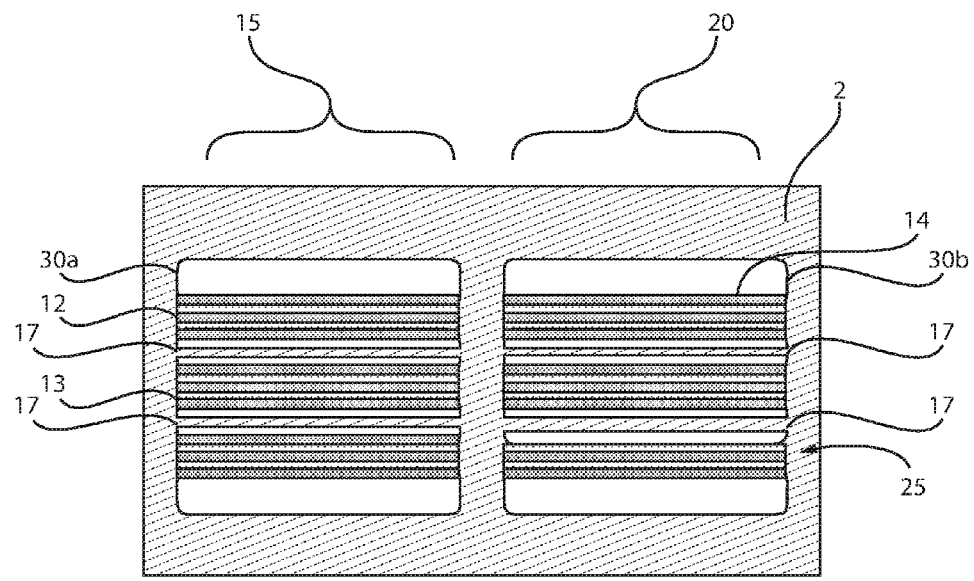
FIG. 14 is a top down view of etching the interlevel dielectric layer to expose a portion of the source region portion and the drain region portion of the fin structures, and removing the exposed portions of the source region portion and the drain region portion of the fin structures, in accordance with one embodiment of the present disclosure.
Figure 15:
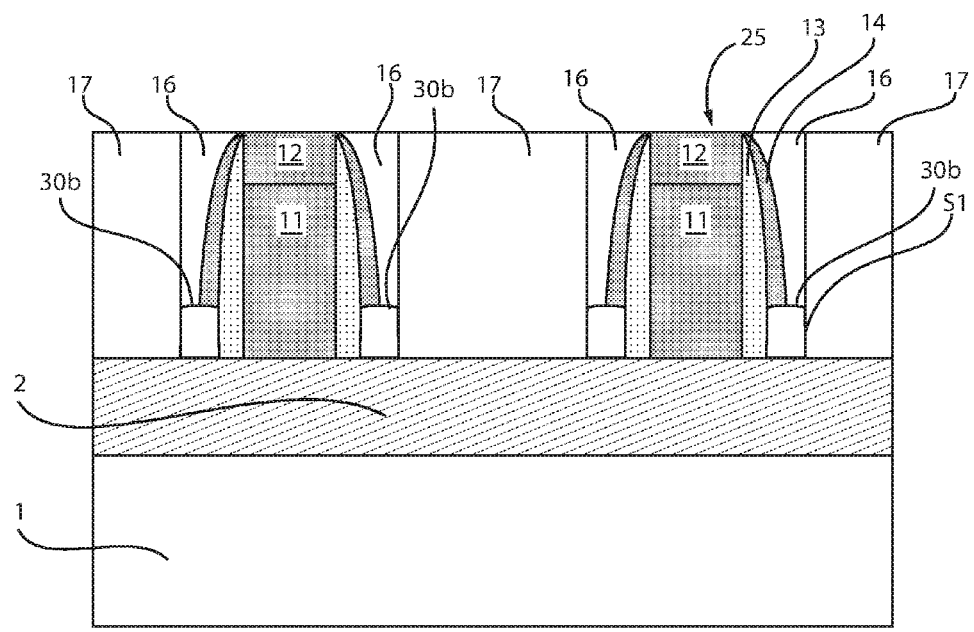
FIG. 15 is a side cross-sectional view of the structure depicted in FIG. 14 from the perspective of section line B-B (cross-section parallel to the fin structure).

FIGS. 14 and 15 depict etching the interlevel dielectric layer 16 to form openings 17 exposing a portion of the source region portion and the drain region portion of the fin structure 10 between adjacent replacement gate structures 25; and etching the exposed portions of the fin structures 10. The etch process for etching the interlevel dielectric layer 16 may also etch the exposed portions of the epitaxial source and drain region structures 30a, 30b. The exposed portions of the epitaxial source and drain region structures 30a, 30b do not include the portion of epitaxial material that is protected by the second gate sidewall spacer 14, e.g., covered by the second gate sidewall spacer 14. The interlevel dielectric layer 16 is not depicted in FIG. 14 to more clearly depict the source and drain region portions of the fin structures 10 following etching. It is noted that FIG. 15 depicts portions of the FinFET structures being formed in the p-type device region 20. The portions of the FinFET structures being formed in the n-type device region 15 are typically similar to the portions of the FinFET structures being formed in the p-type device region 20 at this stage of the process flow.

In some embodiments, the openings 17 that are formed in the interlevel dielectric layer 16 may have the geometry of trenches, vias or a combination thereof. In some embodiments, the openings 17 may be formed using photolithography and etch processes. For example, a photoresist etch mask can be produced by applying a photoresist layer to the upper surface of the interlevel dielectric layer 16, exposing the photoresist layer to a pattern of radiation, and then developing the pattern into the photoresist layer utilizing a resist developer. The photoresist etch mask may be positioned so that portions of the interlevel dielectric layer 16 are not protected by the photoresist etch mask in order to provide the openings 17.

In some embodiments, the openings 17 may be formed in accordance with a self-aligned contact (SAC) process flow, which is typically suitable for tight pitch applications. As the pitch is increased for technology nodes of 64 nm or less, mask alignment and trench formation can be challenging. In these scenarios, self-aligned contact schemes can be advantageous. For a self-aligned contact scheme, trench forming and etch processes are applied, in which at least some spacer material, e.g., the material of at least one of the first and second gate sidewalls spacers 13, 14, may be exposed to the etch processes. In some embodiments, the second gate sidewall spacer 14 protects at least some of the epitaxial material of the epitaxial source and drain region structures 30a, 30b that is present under the second gate sidewall spacer 14 to allow for a contact to be formed on it. In some embodiments, this provides that the openings 17 and the later formed metal deposited within the trench, i.e., interconnect 19, can be self-aligned contact (SAC) structures.

The exposed portions of the interlevel dielectric layer 16 are then removed by a selective etch. The selective etch may be an anisotropic etch or an isotropic etch. One example of an anisotropic etch that is suitable for forming the openings 17 is reactive ion etch (RIE). Other examples of anisotropic etching that can be used at this point of the present disclosure include ion beam etching, plasma etching or laser ablation.

Removing the material of the interlevel dielectric layer 16 to define the opening 17 exposes a portion of the source region portion and the drain region portion of the fin structures 10 that is present between two adjacent replacement gate structures 25. In one embodiment, the exposed portions of the fin structures 10 and the surrounding portions of the epitaxial source and drain region structures 30a, 30b are removed by an etch process to expose a sidewall for the source and drain region portions of the fin structures 10, as well as to expose a sidewall of the epitaxial source and drain structures 30a, 30b at the exposed sidewall of the fin structures 10. After the etch step to form the opening 17, the exposed fin structure 10 and the epitaxial source and drain region 30a, 30b that are present on the sidewall of the fin structure 10 and are surrounded by the second gate sidewall spacer 14 are exposed, i.e., can be seen. Further, removing the portion of the fin structures 10 that are exposed by the opening 17 through the interlevel dielectric layer 16 may define portions of the fin structures 10, so that a separate portion of the fin structure 10 corresponds to each of the replacement gate structures 25.

In one embodiment, the exposed portions of the fin structures 10 may be removed by an etch process that is selective to the buried insulating layer 2 and the interlevel dielectric layer 16. The exposed portions of the fin structure 10 may be removed by an anisotropic etch process. Examples of anisotropic etch processes that are suitable for removing the exposed portions of the fin structures 10 include reactive ion etch (RIE), ion beam etching, plasma etching or laser ablation. This etch step may also remove exposed portions of the epitaxial source and drain regions 30a, 30b, which are not protected by the second spacer 14. Therefore, the etch process for removing the exposed portions of the epitaxial source and drain regions 30a, 30b is selective to at least the second spacer 14.

Figure 16:
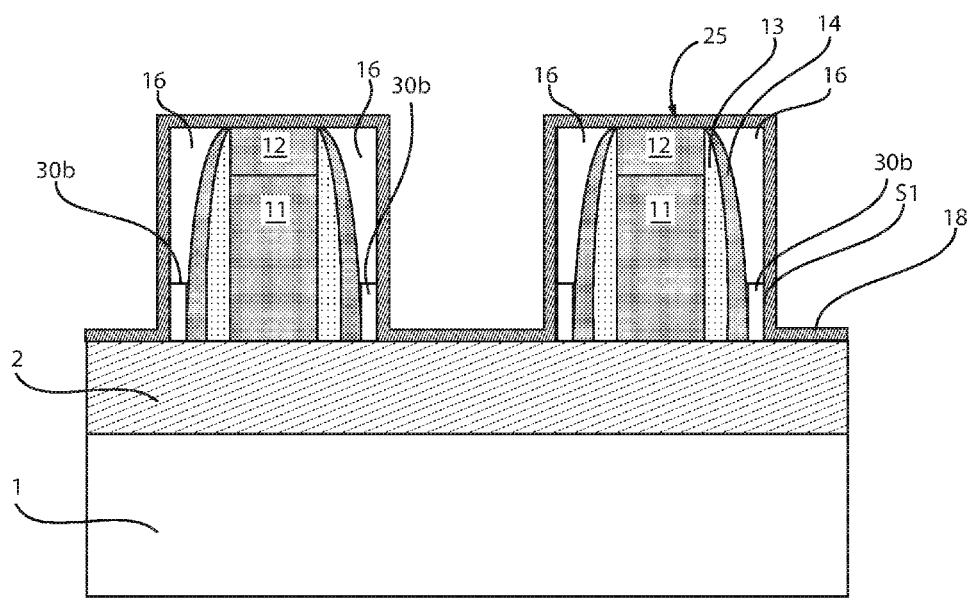
FIG. 16 is a side cross-sectional view parallel to the fin structure depicting forming a metal layer on the at least one sidewall of the source region portion and the drain region portion of the fin structure that is exposed in FIG. 15, in accordance with one embodiment of the present disclosure.
Figure 17:
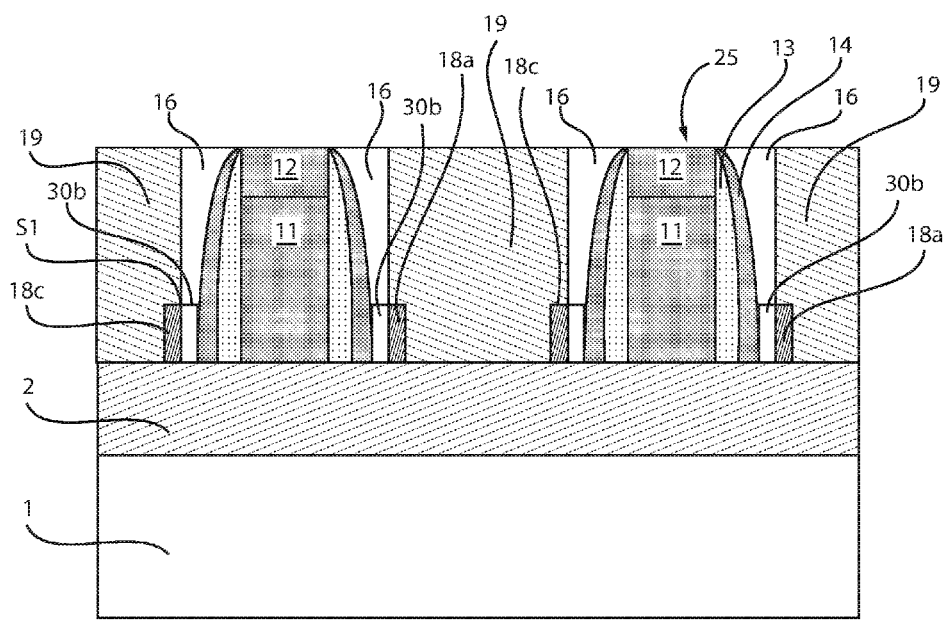
FIG. 17 is a side cross-sectional view parallel to the fin structure depicting converting portions of the metal layer depicted in FIG. 16 into metal semiconductor alloy contact structures on at least one sidewall of the source region portion and the drain region portion of the fin structure, as well as the exposed sidewall of the epitaxial source and drain regions, in accordance with one embodiment of the present disclosure.

FIGS. 16 and 17 depict one embodiment of forming metal semiconductor alloy contact structures 18a, 18b on the exposed sidewalls of the fin structure 10 and the exposed sidewalls of the epitaxial source and drain region structures 30a, 30b. The term "sidewall" as used to describe the surface of the fin structures 10, and the surface of the epitaxial source and drain region structures 30a, 30b, that the metal semiconductor alloy contact structure 18a, 18b are formed in direct contact with means the vertical orientated surfaces that are substantially perpendicular to the upper surface of the buried insulating layer 2. In one embodiment, the metal semiconductor alloy contact structures 18a, 18b are not formed on an upper surface of the fin structures 10.

FIG. 16 depicts one embodiment of depositing a metal layer 18 on the at least one sidewall S1 of the source and drain region portion of the fin structures and sidewalls of the epitaxial source and drain region 30b that are exposed during the formation of the opening 17 through the interlevel dielectric layer 16. The metal layer 18 is also deposited on the exposed sidewalls of the epitaxial source and drain regions 30a, 30b that are exposed during the etch process sequence that forms the opening 17.

In one embodiment, the metal layer 18 may be deposited on the upper surface of the interlevel dielectric layer 16, the upper surface of the sacrificial gate cap 12, the sidewall surfaces of the interlevel dielectric layer 16 that define the opening 17, the sidewall surfaces S1 of the epitaxial source and drain region structures 30a, 30b, the sidewall surfaces of the fin structures 10, and the base of the trench provided by the opening 17 that includes the exposed surface of the semiconductor substrate 5, i.e., buried insulating layer 2. The metal layer 18 may be deposited using a conformal deposition process. The term "conformal" as used to describe a conformal deposition process or a conformal layer denotes a layer having a thickness that does not deviate from greater than or less than 20% of an average value for the thickness of the layer. The metal layer 18 may be deposited using physical vapor deposition (PVD) methods or chemical vapor deposition (CVD) methods. Examples of physical vapor deposition (PVD) that are suitable for forming the metal containing material include sputtering and plating. As used herein, "sputtering" means a method of depositing a film of material on a semiconductor surface. A target of the desired material, i.e., source, is bombarded with particles, e.g., ions, which knock atoms from the target, and the dislodged target material deposits on the semiconductor surface. Examples of sputtering apparatuses include DC diode type systems, radio frequency (RF) sputtering, magnetron sputtering, and ionized metal plasma (IMP) sputtering.

In one example, the metal layer 18 may be composed of nickel or nickel platinum alloy. The metal layer 18 may also include at least one of nickel (Ni), cobalt, (Co), tungsten (W), titanium (Ti), tantalum (Ta), aluminum (Al), platinum (Pt) and combinations thereof. In one example, the metal layer 18 is a nickel (Ni) and platinum (Pt) alloy, wherein the nickel (Ni) content is greater than or equal to 90 at. % and the platinum (Pt) content is less than or equal to 10 at. %. In some example, the metal layer 18 may be composed of Ni, Pt, Co, and alloys such as NiPt. The metal layer 18 may have a thickness ranging from 5 nm to 20 nm. In another embodiment, the metal layer 18 may have a thickness ranging from 6 nm to 15 nm. An optional diffusion barrier layer (not shown), such as, for example, TiN or TaN, can be deposited atop the metal layer 18.

FIG. 17 depicts one embodiment of converting portions of the metal layer 18 depicted in FIG. 16 into metal semiconductor alloy contact structures 18a, 18b on at least one sidewall of the source region portion and the drain region portion of the fin structure 10, as well as the sidewall portion of the epitaxial source and drain region structures 30a, 30b. In some embodiments, converting the metal layer 18 into the metal semiconductor alloy contact structures 18a, 18b includes an anneal process to react, e.g., interdiffuse, the metal of the metal layer 18 with the semiconductor material of the fin structure 10 and the epitaxial source and drain region structures 30a, 30b that are in direct contact with one another. After annealing, any unreacted metal, e.g., metal that is present on dielectric material, such as the interlevel dielectric layer 16 and the buried dielectric layer 2, can be removed selectively to the metal semiconductor alloy contact structures 18a, 18b.

In some embodiments, the thermal annealing step may include, but is not limited to, rapid thermal annealing, furnace annealing, laser annealing and combinations thereof. In one embodiment, in which the metal layer 18 is composed of nickel (Ni), and the metal semiconductor alloy contact structures 18a, 18b are composed of nickel silicide (NiSi), the anneal process for converting the portions of the metal layer 18 that are present on semiconductor containing material may include a temperature ranging from 400° C. to 600° C. In some other embodiments, the thermal anneal for converting the metal layer to a metal semiconductor alloy contact includes a two stage anneal, in which the first stage of the anneal may be completed at a first temperature ranging from 350° C. to 600° C. for a time period ranging from 1 second to 90 seconds. In some embodiments, the second stage of the thermal annealing process for forming the metal semiconductor alloy portions 18a, 18b includes a second annealing step at a higher second temperature that ranges from 600° C. to 800° C.

The metal semiconductor alloy material of the metal semiconductor alloy contact structures 18a, 18b is selectively formed on semiconductor containing materials, such as the exposed sidewalls of the fin structures 10 and the epitaxial source and drain regions 30a, 30b, and is not formed on dielectric containing surfaces. For example, the metal semiconductor alloy material, e.g., silicide, is not formed on the buried insulating layer 2 at the base of the opening 17.

Following conversion of the portions of the metal layer that are present on the sidewall of the fin structures 10 and the sidewalls of the epitaxial source and drain regions 30a, 30b to the metal semiconductor alloy contact structures 18a, 18b, the portions of the metal layer 18 that have not reacted to form a metal semiconductor alloy may be removed by an etch process. More specifically, the etch process removes the non-reacted metal portion of the metal layer that are present on the dielectric surfaces provided by the upper surface of the interlevel dielectric layer 16, the upper surface of the sacrificial gate cap 12, the sidewall surfaces of the interlevel dielectric layer 16 and the buried insulating layer 2 selectively to the metal semiconductor alloy contact structures 18a, 18b.

The metal semiconductor alloy of the metal semiconductor alloy contact structures 18a, 18b is typically a silicide. A metal silicide is a metal semiconductor alloy in which the semiconductor component includes silicon (Si). In some embodiments, the metal semiconductor alloy contact structures 18a, 18b are composed of a metal silicide having a metal component which includes, e.g., Ni, Ti, Co, Pt, Ta, W, Pt, Pd and other like materials. In one example, the metal semiconductor alloy contact structures 18a, 18b are composed of Ni silicide. In some embodiments, the metal semiconductor alloy contact structures 18a, 18b may also include an alloying additive including, but not limited to, Pt, Pd, Re, W or combinations thereof. In some embodiments, the metal semiconductor alloy contact structures 18a, 18b may each have a thickness ranging from 2 nm to 50 nm, as measured from the sidewall of the opening, i.e., the sidewall of the interlevel dielectric layer 16 that defines the opening 17.

The metal semiconductor alloy contact structures 18a, 18b that are formed on the sidewalls of the source region portion and drain region portion of the fin structures and the exposed sidewall of the epitaxial source and drain regions 30a, 30b have a greater area than the metal semiconductor alloy contacts that are formed on the upper surface of fin structures, as used in prior semiconductor devices. For example, the area of the metal semiconductor alloy contact structures 18a, 18b that are formed on the sidewalls S1 of the source region portion and drain region portion of the fin structures 10 and the sidewalls of the epitaxial source and drain region structures 30a, 30b may increase the area of the contact area by 1.5× or greater when compared to the area of a contact that is present only on the upper surface of the fin structures (as typically provided in prior FinFET devices. In one embodiment, when the epitaxial source and drain regions 30a, 30b are merged, the height H1 of the metal semiconductor alloy contact structures 18a, 18b may range from 40 nm to 220 nm. In another embodiment, the height H1 of the metal semiconductor alloy contact structures 18a, 18b may range from 40 nm to 100 nm. In another embodiment, when the epitaxial source and drain regions are not merged, the height H1 of the metal semiconductor alloy contact structures 18a, 18b may range from 10 nm to 205 nm. In another embodiment, when the epitaxial source and drain regions are not merged, the height H1 of the metal semiconductor alloy contact structures 18a, 18b may range from 45 nm to 105 nm. The height H1 of the metal semiconductor alloy contact structures 18a, 18b provides increased width to contact area when compared to prior structures that do not have the height H1 of the metal semiconductor alloy contact structure that is provided by the present disclosure.

In some embodiments, the fin structures 5 are doped in the source and drain region using a drive in anneal to drive dopant from the epitaxial source and drain regions 30a, 30b into the fin structures. The drive in anneal may occur simultaneously with the anneal for forming the metal semiconductor alloy contact structures 18a, 18b.

In comparison to contacts formed on only an upper surface of the fin structures, the increased height of the metal semiconductor alloy contact structures 18a, 18b reduces the access resistance of the contact to the source region and drain region portions of the fin structures 10, without increasing the capacitance of the structure.

FIG. 16 also depicts one embodiment of forming interconnects 19 to the metal semiconductor alloy contact structures 18a, 18b. In one embodiment, the interconnects 19 are formed in direct contact with the metal semiconductor alloy contact structures 18a, 18b and fill the opening 17 in the interlevel dielectric layer 16. The interconnect 19 may also be referred to as a metal stud, a metal via, or a metal fill. Metal interconnects 19 are formed by depositing a conductive metal into the openings 17 in the interlevel dielectric layer 16 to the source region portion and the drain region portion of the fin structures 10 using a deposition process, such as physical vapor deposition (PVD). The interconnects 19 may be formed in direct contact with the metal semiconductor alloy contact structures 18a, 18b at the base of the openings 17. Examples of physical vapor deposition (PVD) that are suitable for forming the interconnect 19 include sputtering and plating. Examples of sputtering apparatuses suitable for forming the interconnect 19 include DC diode type systems, radio frequency (RF) sputtering, magnetron sputtering, and ionized metal plasma (IMP) sputtering. The interconnect 19 may also be formed using chemical vapor deposition (CVD). The interconnect 19 may be composed of a conductive metal, such as tungsten, copper, aluminum, silver, gold, and alloys thereof. In some embodiments, a Ti/TiN liner may be formed on the sidewalls and the base of the opening 17 to the metal semiconductor alloy contact structures 18a, 18b prior to depositing a tungsten fill to form the interconnects 19.

Figure 18:
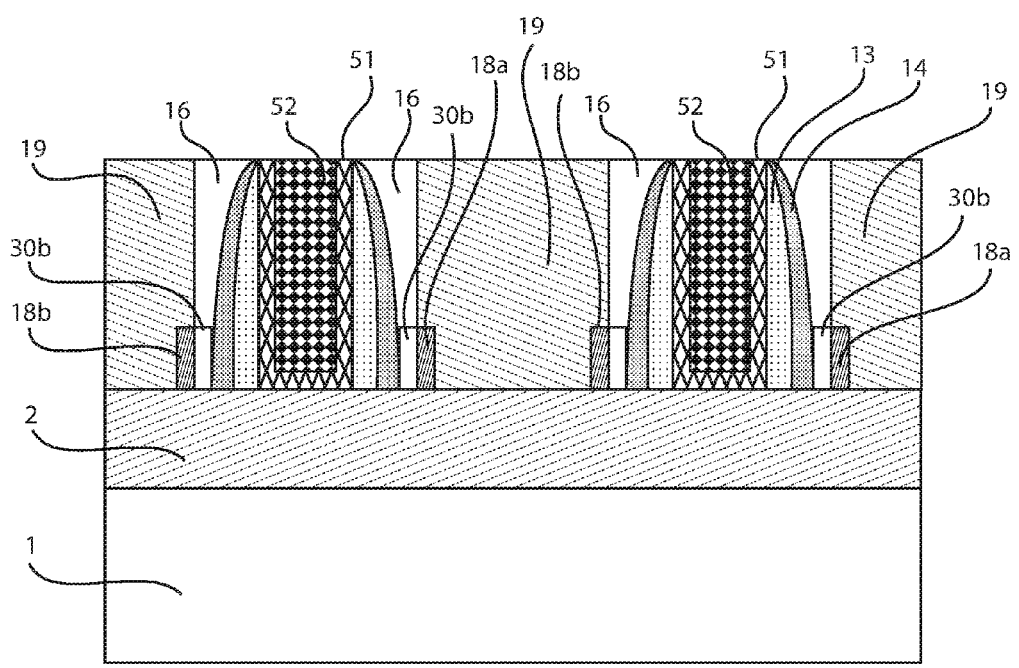
FIG. 18 is a side cross-sectional view parallel to the fin structure depicting removing the replacement gate structures and forming a functional gate structure to the FinFET devices, in accordance with one embodiment of the present disclosure.

FIG. 18 depicts one embodiment of removing the replacement gate structures 25 and forming a functional gate structure 50 to a FinFET devices. In one embodiment, the replacement gate structure 50 may be removed by a selective etch. The replacement gate structure 50 may be removed using a wet or dry etch process. In one embodiment, the replacement gate structure 50 is removed by reactive ion etch (RIE). In one example, an etch step for removing the replacement gate structure 10 can include an etch chemistry for removing the sacrificial gate material 11 and the sacrificial gate cap 12 of the sacrificial replacement gate structure 50 selective to the fin structures 10, the gate sidewall spacer 13 and the interlevel dielectric 16.

A functional gate structure 50 is formed in the space that is provided by removing the replacement gate structure 25. The functional gate structure 50 is formed in direct contact with a channel portion of the fin structures 10. The functional gate structure 50 typically includes at least one gate dielectric layer 51 and at least one gate conductor layer 52. The at least one gate dielectric layer 51 is typically positioned on at least the channel portion of the fin structures 10. The at least one gate dielectric layer 51 may be formed by a thermal growth process such as, e.g., oxidation, nitridation or oxynitridation. The at least one gate dielectric layer 51 may also be formed by a deposition process such as, e.g., CVD, plasma-assisted CVD, MOCVD, ALD, evaporation, reactive sputtering, chemical solution deposition and other like deposition processes. The at least one gate dielectric layer 51 may also be formed utilizing any combination of the above processes.

The at least one gate dielectric layer 51 may be comprised of an insulating material having a dielectric constant of about 4.0 or greater. In another embodiment, the at least one gate dielectric layer 51 is comprised of an insulating material having a dielectric constant greater than 7.0. The dielectric constants mentioned herein are relative to a vacuum. In one embodiment, the at least one gate dielectric layer 51 employed in the present disclosure includes, but is not limited to, an oxide, nitride, oxynitride and/or silicates including metal silicates, aluminates, titanates and nitrides. In one example, when the at least one gate dielectric layer 51 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 51 may vary, but typically, the at least one gate dielectric layer 51 has a thickness from 1 nm to 10 nm. In another embodiment, the at least one gate dielectric layer 51 has a thickness from 1 nm to 3 nm.

After forming the material layer for the at least one gate dielectric layer 51, a blanket layer of a conductive material which forms the at least one gate conductor 52 of functional gate structure 50 is formed on the at least one gate dielectric 51 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing.

FIG. 18 depicts one embodiment of a semiconductor device structure that includes at least one fin field effect transistor including a fin structure 10 including a channel region portion (under the functional gate structure 50), a source region portion and a drain region portion. A metal semiconductor alloy contact structure 18a, 18b, 18c is present on a sidewall S1 of at least one of the source region portion and the drain region portion of the fin structure 10. The metal semiconductor alloy contact structure 18a, 18b, 18c is not present on an upper surface of said at least one of the drain region portion and the source region portion of the fin structure 10. A functional gate structure 50 is present on the channel region portion of the fin structure.

In the structure depicted in FIG. 18, two FinFETs are being depicted adjacent to one another. Each of the two adjacent fin field effect transistors include the metal semiconductor alloy contact structures 18a, 18b on the sidewall S1 of at least one of the source region portion and the drain region portion of a fin structure 10, as well as being present on the sidewalls of the epitaxial source and drain regions structures 30a, 30b.

In another embodiment, the process sequence for forming the FinFET structure depicted in FIG. 17 is formed using a gate first process sequence, which is not depicted in the supplied figures. The method depicted in FIGS. 1-17 is a gate last process that includes forming a replacement gate structure. In another embodiment, a functional gate structure is formed instead of a replacement gate structure, and the functional gate structure remains throughout the formation of the fin structure. This is referred to as a gate first process sequence. Both gate first and gate last process sequences are applicable to the present disclosure.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A device structure comprising: a semiconductor body having a height greater than its width, the semiconductor body including a source region portion and a drain region portion; and
a metal semiconductor alloy contact structure present on a sidewall of at least one of the source region portion and the drain region portion of the semiconductor body and present on a sidewall of epitaxial source and drain region structures;
wherein the metal semiconductor alloy contact is not present on an upper surface of the semiconductor body, and is not present on an upper surface of the epitaxial source and drain region structures.

2. The device structure of claim 1, wherein the metal semiconductor alloy contact structure is not present on an upper surface of said at least one of the drain region portion and the source region portion of the semiconductor body.

3. The device structure of claim 1, wherein the semiconductor body is comprised of a semiconductor material selected from the group consisting of silicon, silicon germanium and combinations thereof.

4. The device structure of claim 1, wherein the metal semiconductor alloy contact structure is a silicide.

5. The device structure of claim 1, wherein the metal semiconductor alloy is selected from the group consisting of nickel silicide, tungsten silicide, cobalt silicide, platinum silicide, and combinations thereof.

6. The device structure of claim 1, wherein the metal semiconductor alloy contact have a height ranging from 25 nm to 220 nm.

7. A device structure comprising:
a semiconductor body having a height greater than its width, the semiconductor body including a source region portion and a drain region portion; and
a metal semiconductor alloy contact structure present on a sidewall of at least one of the source region portion and the drain region portion of the semiconductor body and present on a sidewall of epitaxial source and drain region structures, wherein the metal semiconductor alloy contact structure is not present on an upper surface of said at least one of the drain region portion and the source region portion of the semiconductor body.

8. The device structure of claim 7, wherein the semiconductor body is comprised of a semiconductor material selected from the group consisting of silicon, silicon germanium and combinations thereof.

9. The device structure of claim 7, wherein the metal semiconductor alloy contact structure is a silicide.

10. The device structure of claim 7, wherein the metal semiconductor alloy is selected from the group consisting of nickel silicide, tungsten silicide, cobalt silicide, platinum silicide, and combinations thereof.

11. The device structure of claim 7, wherein the metal semiconductor alloy contact is not present on an upper surface of the semiconductor body, and is not present on an upper surface of the epitaxial source and drain region structures.

12. The device structure of claim 7, wherein the metal semiconductor alloy contact have a height ranging from 25 nm to 220 nm.

13. A device structure comprising:
a semiconductor body comprising a source region portion and a drain region portion;
a metal semiconductor alloy contact structure present on a sidewall of at least one of the source region portion and the drain region portion of the semiconductor body and present on a sidewall of epitaxial source and drain region structures, wherein the metal semiconductor alloy contact structure is not present on an upper surface of said at least one of the drain region portion and the source region portion of the semiconductor body; and
a gate structure present on the channel region portion of the semiconductor body.

14. The device of claim 13, wherein the semiconductor body is comprised of a semiconductor material selected from the group consisting of silicon, silicon germanium and combinations thereof.

15. The device of claim 13, wherein the semiconductor body is comprised of a semiconductor material selected from the group consisting of silicon, silicon germanium and combinations thereof.

16. The device of claim 13, wherein the metal semiconductor alloy contact structure is a silicide.

17. The device of claim 13, wherein the metal semiconductor alloy is selected from the group consisting of nickel silicide, tungsten silicide, cobalt silicide, platinum silicide, and combinations thereof.

18. The device of claim 13, wherein the metal semiconductor alloy contact is not present on an upper surface of the semiconductor body, and is not present on an upper surface of the epitaxial source and drain region structures.

19. The device of claim 13, wherein the metal semiconductor alloy contact have a height ranging from 25 nm to 220 nm.

* * * * *